US012765370B2

(12) United States Patent
Scharf et al.

(10) Patent No.: US 12,765,370 B2
(45) Date of Patent: Oct. 13, 2026

(54) MOLDED PACKAGE AND POWER MODULE WITH TEMPERATURE SENSE CAVITY

(71) Applicant: Infineon Technologies AG, Neubiberg (DE)

(72) Inventors: Thorsten Scharf, Lappersdorf (DE); Michael Fügl, Neumarkt (DE)

(73) Assignee: Infineon Technologies AG, Neubiberg (DE)

( * ) Notice: Subject to any disclaimer, the term of this patent is extended or adjusted under 35 U.S.C. 154(b) by 392 days.

(21) Appl. No.: 18/480,620

(22) Filed: Oct. 4, 2023

(65) Prior Publication Data

US 2025/0118614 A1 Apr. 10, 2025

(51) Int. Cl.

*H10W 40/00* (2026.01)
*H10W 74/10* (2026.01)
*H10W 76/15* (2026.01)
*H10W 90/00* (2026.01)

(52) U.S. Cl.

CPC .......... *H10W 40/00* (2026.01); *H10W 74/111* (2026.01); *H10W 76/15* (2026.01); *H10W 90/00* (2026.01)

(58) Field of Classification Search

CPC .... H01L 23/34; H01L 23/053; H01L 25/0655
See application file for complete search history.

(56) References Cited

U.S. PATENT DOCUMENTS

2012/0104591 A1* 5/2012 Warren ............... H01L 23/4334 438/122
2015/0373880 A1* 12/2015 Colgan ................... H01L 23/34 165/185
2018/0162722 A1* 6/2018 Male ................... B81C 1/00325
2019/0067156 A1* 2/2019 Kim .................... H01L 25/0657
2022/0155109 A1* 5/2022 Koduri ................. G01D 11/245
2022/0415762 A1* 12/2022 Manack ............ H01L 23/49861
2023/0095185 A1* 3/2023 Molina ................... H01L 24/16 257/666
2024/0363466 A1* 10/2024 Solas .................. H01L 23/3157
2024/0371659 A1* 11/2024 Liu ......................... H01L 23/24

* cited by examiner

*Primary Examiner* — Mamadou L Diallo
(74) *Attorney, Agent, or Firm* — Murphy, Bilak & Homiller, PLLC

(57) ABSTRACT

A molded package includes: a mold compound; a first power semiconductor die encapsulated by the mold compound; and a first temperature sense cavity formed in a surface of the mold compound. The molded package is devoid of temperature sense terminals. The first temperature sense cavity is dimensioned to receive a temperature sensor and/or a combined area of each sidewall and a bottom of the first temperature sense cavity is greater than an area of an opening in the surface of the mold compound that delineates the first temperature sense cavity. A corresponding power module and a power electronics assembly that includes the molded package or the power module are also described.

20 Claims, 10 Drawing Sheets

A-A'

MOLDED PACKAGE AND POWER MODULE WITH TEMPERATURE SENSE CAVITY

BACKGROUND

Some types of molded packages and power modules used in power applications such as main inverters, battery management systems, on-board chargers, etc. do not have internal temperature sense capability. For these types of packages and modules, temperature sensing is typically implemented by direct contact using an external temperature sensor to measure the exterior temperature of the mold body (for packages) or module frame (for power modules). However, the mold body or module frame exterior temperature is quite different from the actual temperature of each die (chip) included in the molded package or power module. For IR (infrared) temperature sensing, the absorption coefficient of the mold body or module frame material changes over time due to aging, further decreasing die temperature sense accuracy.

Thus, there is a need for an improved design for molded packages and power modules that do not have internal temperature sense capability.

SUMMARY

According to an embodiment of a molded package, the molded package comprises: a mold compound; a first power semiconductor die encapsulated by the mold compound; and a first temperature sense cavity formed in a surface of the mold compound, wherein the molded package is devoid of temperature sense terminals, wherein the first temperature sense cavity is dimensioned to receive a temperature sensor and/or a combined area of each sidewall and a bottom of the first temperature sense cavity is greater than an area of an opening in the surface of the mold compound that delineates the first temperature sense cavity.

According to an embodiment of a power module, the power module comprises: an electrically insulative frame; a lid; a first power semiconductor die attached to a substrate and enclosed by the electrically insulative frame, the lid and the substrate; and an opening in the lid, wherein the opening in the lid is dimensioned to receive a temperature sensor.

According to an embodiment of a power electronics system, the power electronics system comprises: a circuit board; a molded package mounted to the circuit board; and a temperature sensor, wherein the molded package comprises: a mold compound; a first power semiconductor die encapsulated by the mold compound; and a first temperature sense cavity formed in a surface of the mold compound, wherein the molded package is devoid of temperature sense terminals, wherein the first temperature sense cavity is dimensioned to receive the temperature sensor and/or a combined area of each sidewall and a bottom of the first temperature sense cavity is greater than an area of an opening in the surface of the mold compound that delineates the first temperature sense cavity.

According to an embodiment of a power electronics system, the power electronics system comprises: a circuit board; a power module mounted to the circuit board; and a temperature sensor, wherein the power module comprises: an electrically insulative frame; a first power semiconductor die enclosed by the electrically insulative frame; and a first temperature sense cavity formed in a surface of the electrically insulative frame, wherein the first temperature sense cavity is dimensioned to receive the temperature sensor and/or a combined area of each sidewall and a bottom of the first temperature sense cavity is greater than an area of an opening in the surface of the electrically insulative frame that delineates the first temperature sense cavity.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

The embodiments described herein provide a design for molded packages and power modules that do not have internal temperature sense capability. The design includes a temperature sense cavity formed in a surface of a mold compound of a molded package or in a surface of an electrically insulative frame of a power module. The temperature sense cavity is disposed near a power semiconductor die included in the molded package or power module, to enable accurate die temperature sensing. Sensing temperature at the temperature sense cavity yields a temperature measurement that is much closer to the die temperature than sensing temperature at the outer surface of the molded package or power module. More than one temperature sense cavity may be provided, e.g., depending on the number of power semiconductor dies (chips) included in the molded package or power module.

In some embodiments, temperature measurements are taken by a temperature sensor such an NTC (negative temperature coefficient) sensor that is seated in the temperature sense cavity. In these embodiments, the temperature sense cavity is dimensioned to receive the temperature sensor.

In other embodiments, temperature sensing is performed based on the radiation emitted from the temperature sense cavity formed in the mold compound (for molded packages) or the electrically insulative frame (for power modules). The temperature sense cavity nearly mimics an ideal black body which has an absorbance/emittance of 1 at all wavelengths. For example, in the IR (infrared) band, the temperature sense cavity may have an emittance between 0.9 and 1.0 An IR (infrared) sensor may be positioned at the temperature sense cavity to detect the blackbody radiation emitted from the temperature sense cavity, which is nearly independent of mold compound aging.

Described next, with reference to the figures, are exemplary embodiments of a molded package and power module with a temperature sense cavity, and a corresponding power electronics system for high power applications.

Figure 1:
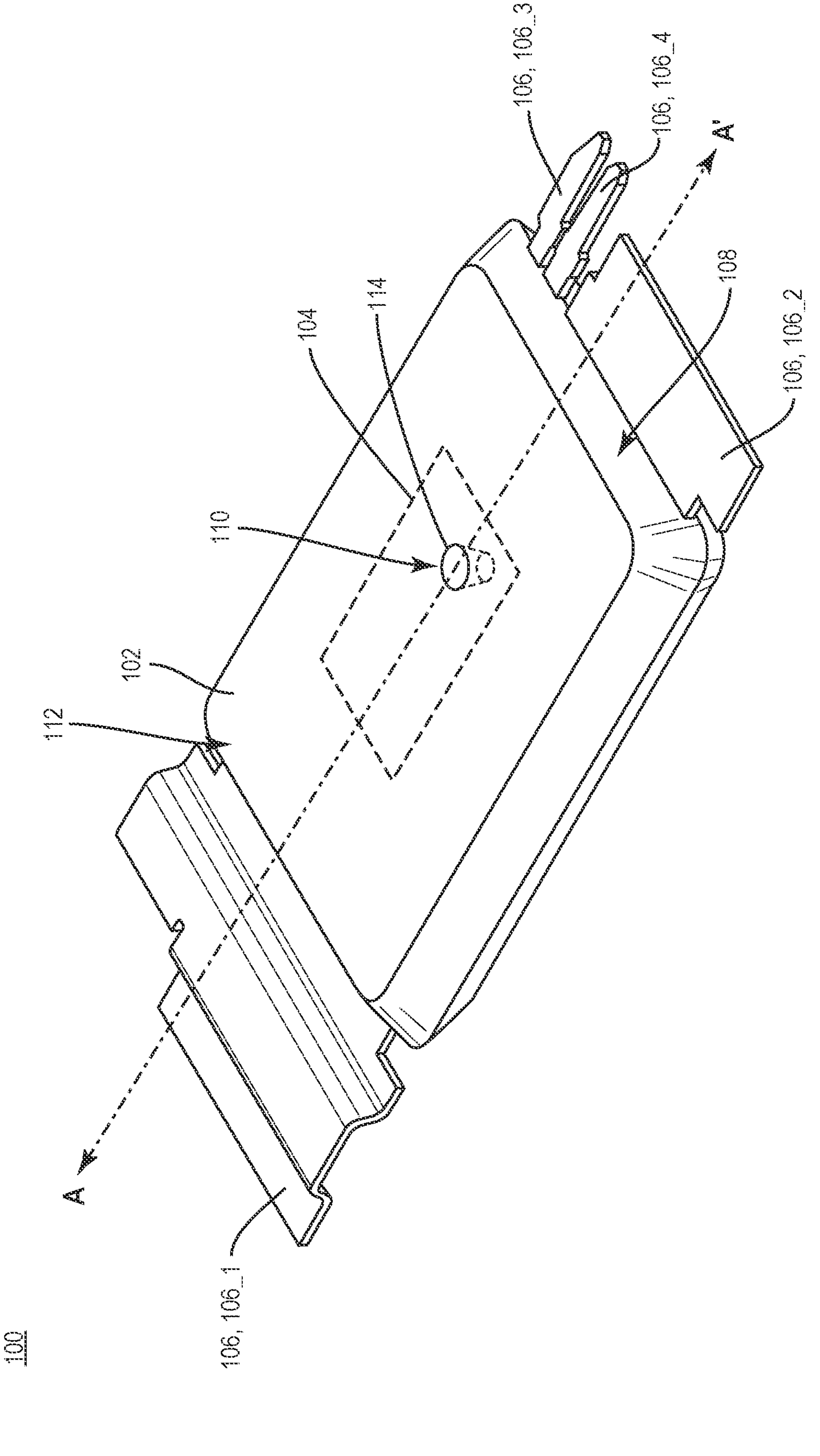
FIG. 1 illustrates a top perspective view of a molded package that is devoid of temperature sense terminals but has at least one temperature sense cavity.

FIG. 1 illustrates a top perspective view of a molded package 100. The molded package 100 includes a mold compound 102 and a power semiconductor die (chip) 104 encapsulated by the mold compound 102. The mold compound 102 is a plastic encapsulant typically formed from an organic resin such as an epoxy resin. The plastic encapsulant may include fillers such as non-melting inorganic materials. Catalysts may be used to accelerate the cure reaction of the organic resin. Other materials such as flame retardants, adhesion promoters, ion traps, stress relievers, colorants, etc. may be added to the plastic encapsulant, as appropriate.

The power semiconductor die 104 encapsulated by the mold compound 102 forms part of a power electronics circuit such as a DC/AC inverter, a DC/DC converter, an AC/DC converter, a DC/AC converter, an AC/AC converter, a multi-phase inverter, an H-bridge, etc. The power semiconductor die 104 may be a power transistor die, a power diode die, a half bridge die, etc., or a die that combines logic and power devices on the same semiconductor substrate. In one embodiment, the power semiconductor die 104 is a power transistor die such as a power Si MOSFET (metal-oxide-semiconductor field-effect transistor) die, an IGBT (insulated gate bipolar transistor) die, a SiC MOSFET die, a GaN HEMT (high electron mobility transistors) die, a JFET (function field-effect transistor) die, etc.

The power semiconductor die 104 is obstructed by the mold compound 102 in the view of FIG. 1 and therefore illustrated using a dashed rectangle. More than one power semiconductor die 104 may be included in the molded package 100.

The molded package 100 also includes leads 106 that protrude through one or more side faces 108 of the mold compound 102. The leads 106 may be part of a metallic lead frame, with the power semiconductor die 104 being attached to another part of the metallic lead frame. In the case of a single power transistor die 104 included in the molded package 100 or two or more power transistor dies 104 included in the molded package 100 and electrically coupled in parallel to form a power switch device, the leads 106 may include a drain or collector lead 106_1, a source or emitter lead 106_2, a gate lead 106_3, and a source sense lead 106_4.

The molded package 100 may include additional leads 106, depending on the number and type of power semiconductor die(s) 104 included in the molded package 100. For example, the molded package 100 may include a half bridge with the high-side switch device realized by one or more first power transistor dies 104 and the low-side switch device realized by one or more second power transistor dies 104. One set of leads 106 may be used for the high-side switch device and another set of leads 106 may be used for the low-side switch device. The internal electrical connections to each power semiconductor die 104 are obstructed by the mold compound 102 in the view of FIG. 1 and therefore not shown.

In FIG. 1, the molded package 100 is devoid of temperature sense terminals. This means that the molded package 100 does not have internal temperature sense capability. To facilitate accurate sensing of the temperature of each power semiconductor die 104 included in the molded package 100, a temperature sense cavity 110 is formed in the front surface 112 of the mold compound 102. The temperature sense cavity 110 may be aligned with a power semiconductor die 104 or with another part inside the package such as a metal clip, bond wire(s), etc. and which might be the hottest part of the package 100.

Each temperature sense cavity 110 is dimensioned to receive a temperature sensor and/or a combined area of each sidewall and a bottom of the first temperature sense cavity 110 is greater than an area of an opening 114 in the surface 112 of the mold compound 102 that delineates the temperature sense cavity 110. Accordingly, a temperature sensor (not shown in FIG. 1) may be seated in the respective temperature sense cavity 110 for providing direct temperature measurements or an infrared sensor (not shown in FIG. 1) may be aligned with the temperature sense cavity 110 for providing indirect temperature measurements based on the blackbody radiation emitted by the temperature sense cavity 110 in the IR spectrum.

Figure 2:
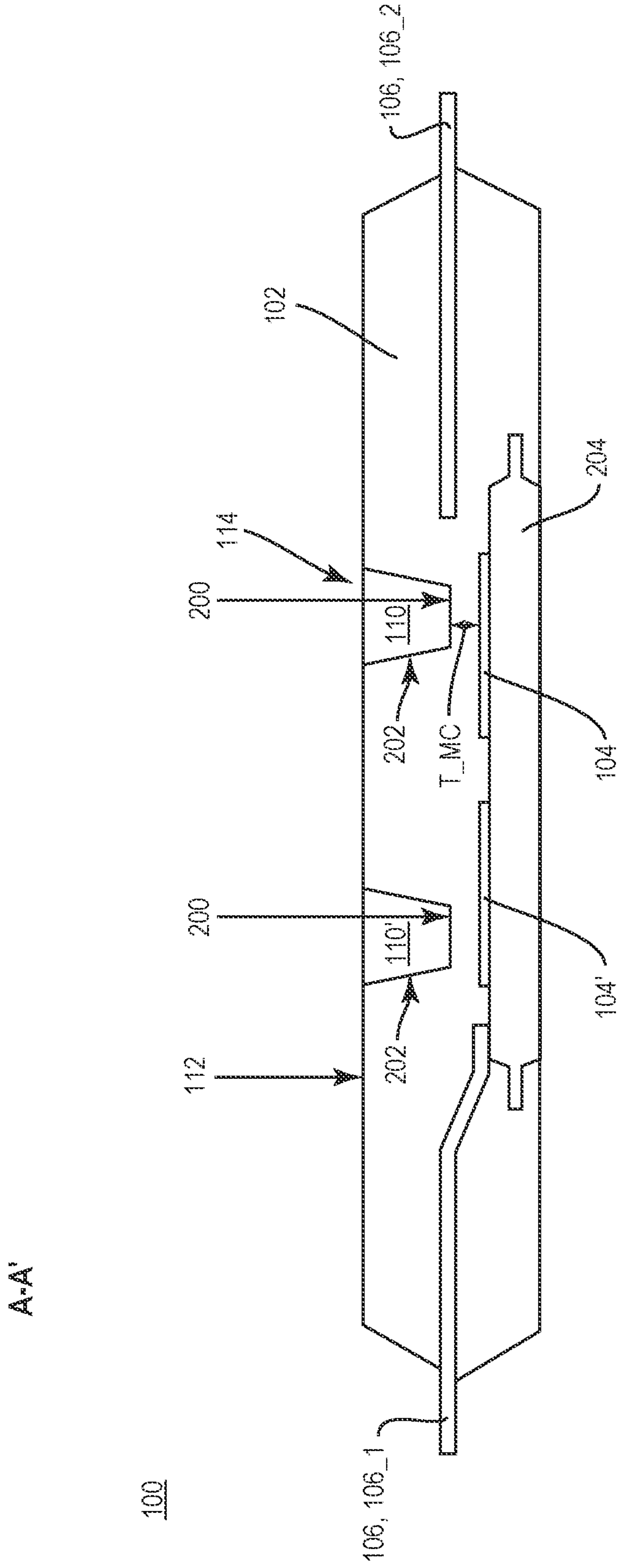
FIG. 2 illustrates a cross-sectional view of the molded package along the line labelled A-A' in FIG. 1, according to an embodiment.

FIG. 2 illustrates a cross-sectional view of the molded package 100 along the line labelled A-A' in FIG. 1, according to an embodiment. In FIG. 2, the mold compound 102 has a thickness T_MC that is less than 1 mm (millimeters) at the bottom 200 of the temperature sense cavity 110. For example, the thickness T_MC of the mold compound 102 may be 200 μm (microns) or less at the bottom 200 of the temperature sense cavity 110.

In FIG. 2, each sidewall 202 of the temperature sense cavity 110 is shown as being tapered such that the opening 114 in the surface 112 of the mold compound 102 that delineates the temperature sense cavity 110 is larger than the area of the bottom 200 of the temperature sense cavity 110. For example, the temperature sense cavity 110 may have the shape of a cylinder with a tapered sidewall 202. The sidewall 202 may be tapered if the temperature sense cavity 110 is formed during the molding process. If the temperature sense cavity 110 is formed after molding, the sidewall 202 instead may not have a taper. In one embodiment, the combined area of the bottom 200 (B_area) of the temperature sense cavity 110 and the cylinder part of the temperature sense cavity 110 (C_area) defined by the sidewall 202 is greater than the area of the opening 114 (O_area) in the surface 112 of the mold compound 102 that delineates the temperature sense cavity 110, i.e., (B_area+C_area)>O_area, to ensure optimal blackbody radiation emission from the temperature sense cavity 110 in the IR spectrum.

Each sidewall 202 of the temperature sense cavity 110 may be roughened, to enhance the blackbody radiation emittance property of the temperature sense cavity 110 in the IR spectrum. In one embodiment, the temperature sense cavity 110 is formed post molding by drilling (e.g., laser drilling, mechanical drilling, etc.) the temperature sense cavity 110 into the front surface 112 of the mold compound 102. The laser drilling process may roughen each sidewall 202 of the temperature sense cavity 110. In another embodiment, the temperature sense cavity 110 is formed during molding and each sidewall 202 of the temperature sense cavity 110 is roughened by a post molding roughening process such as mechanical roughening.

As shown in FIG. 2, the power semiconductor die 104 may be attached to a substrate 204 encapsulated by the mold compound 102. The substrate 204 may be an insulated metal substrate (IMS), a DBC (direct bonded copper) substrate, an AMB (active metal brazed) substrate, part of a lead frame, etc. A metallized backside of the substrate 204 (out of view in FIG. 2) may be exposed from the mold compound 102 to enable bottom-side cooling of the molded package 100.

Some internal electrical connections to each power semiconductor die 104 included in the molded package 100 are out of view in FIG. 2. For example, in FIG. 2, a drain/collector potential may be applied to a metallized part of the substrate 204 via the drain/collector lead 106_1 of the molded package 100. The drain/collector terminal of the power semiconductor die 104 may be at the backside of the die 104 and attached to the part of the substrate 204 at drain/collector potential. Gate and source terminals of the power semiconductor die 104 may be at the frontside of the die 104 and electrically connected to the source/emitter lead 106_2 and gate lead 106_3, respectively, of the molded package 100 by one or more bond wires, wire ribbons, metal clips, etc. The internal source/emitter and gate connections to the power semiconductor die 104 are not shown in FIG. 2 to provide an unobstructed view of the temperature sense cavity 110 formed in the front surface 112 of the mold compound 102.

If more than one power semiconductor die 104 is included in the molded package 100, an additional temperature sense cavity 110' may be formed in the front surface 112 of the mold compound 102, e.g., near each additional power semiconductor die 104. For example, a second power semiconductor die 104' may be encapsulated by the mold compound 102 and electrically connected to the first power semiconductor die 104 to form part of a power electronics circuit, e.g., one or more switch devices of a half bridge. In this example, a second temperature sense cavity 110' may be formed in the front surface 112 of the mold compound 102 near the second power semiconductor die 104'. Like the first temperature sense cavity 110, the second temperature sense cavity 110' is dimensioned to receive a temperature sensor and/or a combined area of each sidewall 101 and bottom 200 of the second temperature sense cavity 110' is greater than an area of an opening 114' in the front surface 112 of the mold compound 102 that delineates the second temperature sense cavity 110'.

Figure 3:
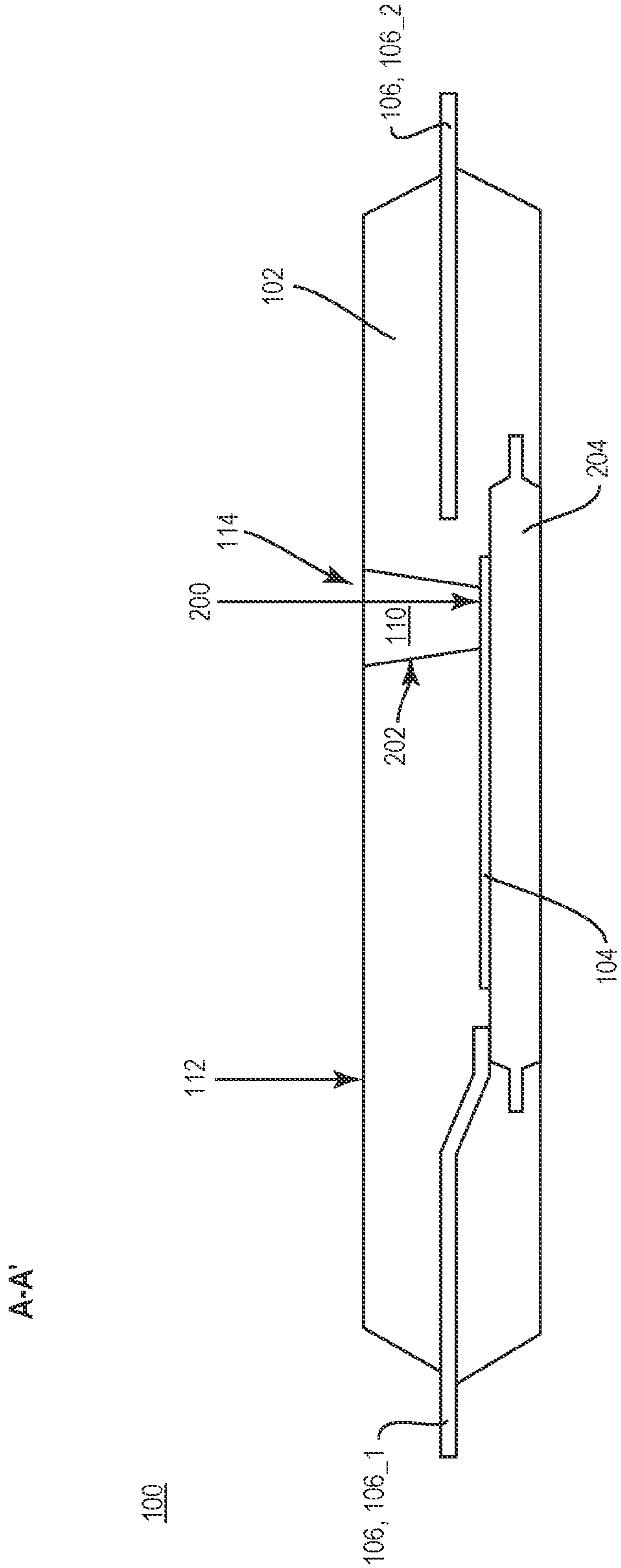
FIG. 3 illustrates a cross-sectional view of the molded package along the line labelled A-A' in FIG. 1, according to another embodiment.

FIG. 3 illustrates a cross-sectional view of the molded package 100 along the line labelled A-A' in FIG. 1, according to another embodiment. In FIG. 3, the mold compound 102 is completely removed from the bottom 200 of the temperature sense cavity 110. In one embodiment, the power semiconductor die 104 or a metal structure such as a metal clip (not shown in FIG. 3) attached to the power semiconductor die 104 is exposed from the mold compound at the bottom 200 of the temperature sense cavity 110.

Figure 4:
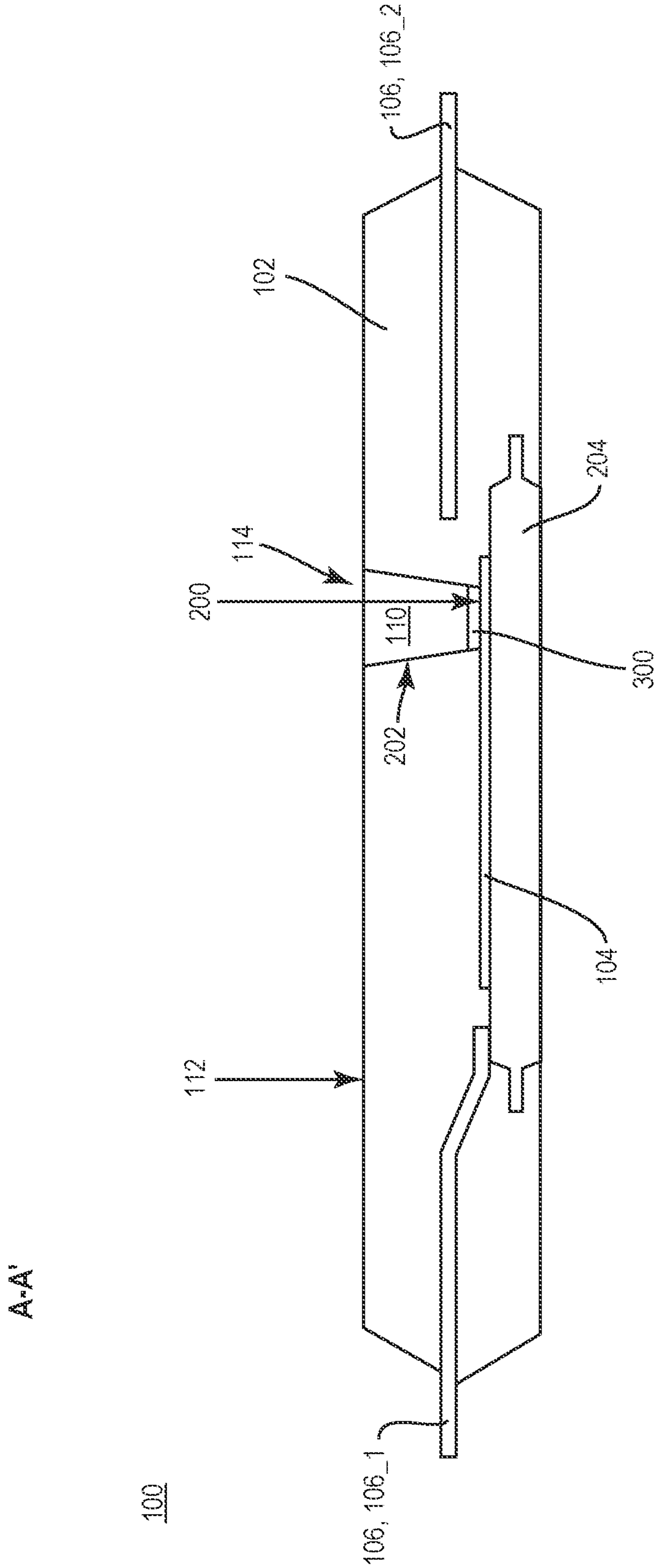
FIG. 4 illustrates a cross-sectional view of the molded package along the line labelled A-A' in FIG. 1, according to another embodiment.

FIG. 4 illustrates a cross-sectional view of the molded package 100 along the line labelled A-A' in FIG. 1, according to another embodiment. In FIG. 4, a 'dark' material 300 covers the power semiconductor die 104 or the metal structure exposed from the mold compound 102 at the bottom 200 of the temperature sense cavity 110. For example, the exposed element may be dyed black to enhance the blackbody emittance property of the temperature sense cavity 110 in the IR spectrum. In another example, the lower part of the temperature sense cavity 110 may be filled with dark silicone, dark thermal grease, dark potting compound, black resist, or other type of 'dark' material. An ideal black body allows all incident radiation to pass into it (no reflected energy) and internally absorbs all the incident radiation (no energy transmitted through the body). The material 300 in FIG. 4 is considered 'dark' in that the material is an ideal black body or a non-ideal black body that absorbs almost all (e.g., at least 90%) of incident radiation in the IR-spectrum. The 'dark' material 300 may also cover at least part of the cavity sidewall 202 and possibly also part of the package topside 112.

Figure 5:
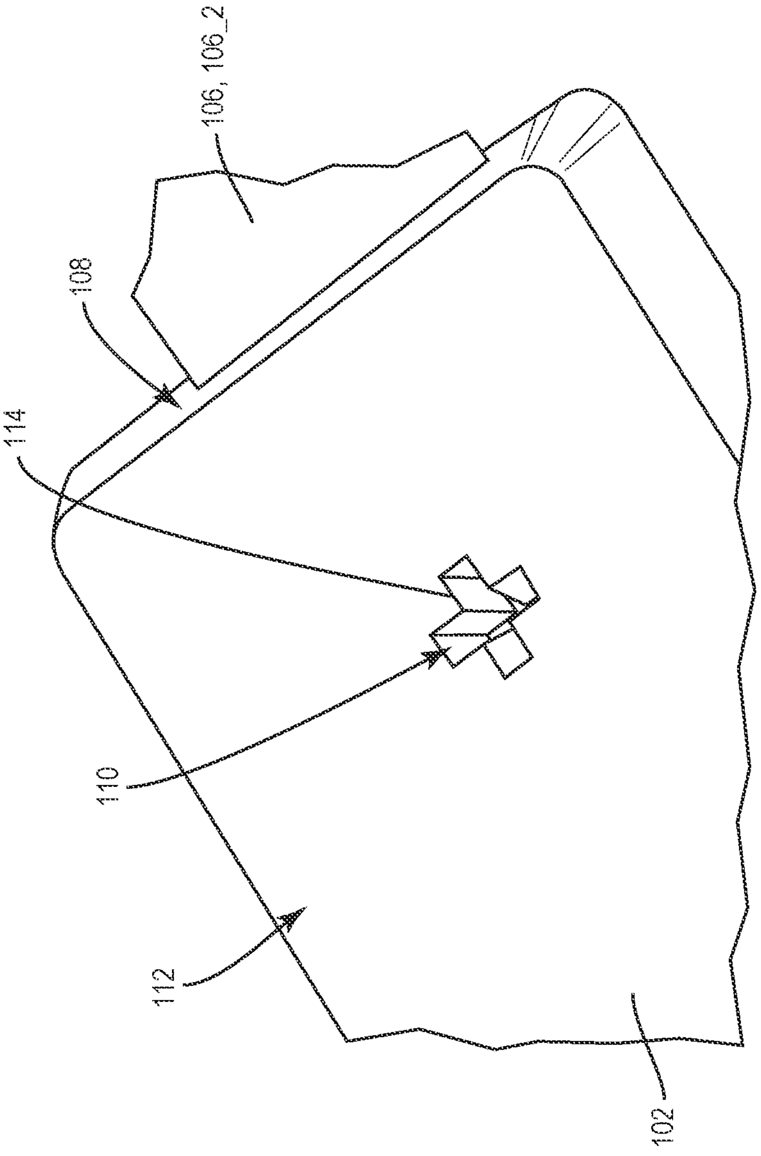
FIG. 5 illustrates a partial top perspective view of the molded package, according to another embodiment.

FIG. 5 illustrates a partial top perspective view of the molded package 100, according to another embodiment. In FIG. 5, the temperature sense cavity 110 has a cross shape in a horizontal cross section. In FIG. 1, the temperature sense cavity 110 has a circular or round shape in a horizontal cross section. More generally, the temperature sense cavity 110 may have any desired shape in a horizontal cross section. For example, the temperature sense cavity 110 instead may have a square shape, rectangular shape, hexagonal shape, triangular shape, etc. in a horizontal cross section. In each case, the temperature sense cavity 110 is dimensioned to receive a temperature sensor and/or a combined area of each sidewall 202 and bottom 200 of the temperature sense cavity 110 is greater than an area of the opening 114 in the front surface 112 of the mold compound 102 that delineates the temperature sense cavity 110.

Figure 6:
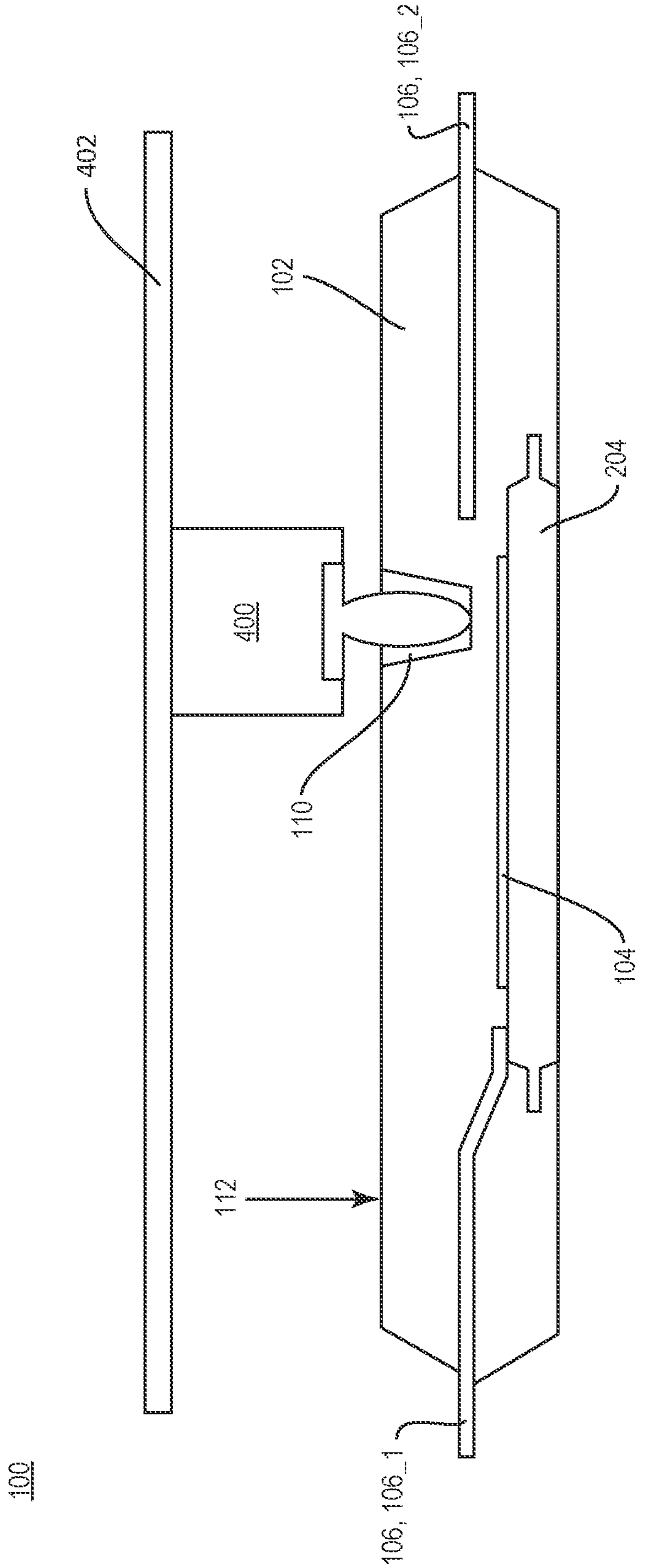
FIG. 6 illustrates a cross-sectional view of the molded package along the line labelled A-A' in FIG. 1, according to another embodiment.

FIG. 6 illustrates a cross-sectional view of the molded package 100 along the line labelled A-A' in FIG. 1, according to another embodiment. In FIG. 6, a temperature sensor 400 is seated in the temperature sense cavity 110. The temperature sensor 400 may be mounted to a printed circuit board (PCB) or other type of support structure 402. The temperature sensor 400 provides direct temperature measurements inside the temperature sense cavity 110. For example, the temperature sensor 400 may be an NTC sensor, a temperature sense diode, a temperature sensing resistor, a thermocouple, etc. The temperature sensor 400 may be epoxy-coated, for example.

Figure 7:
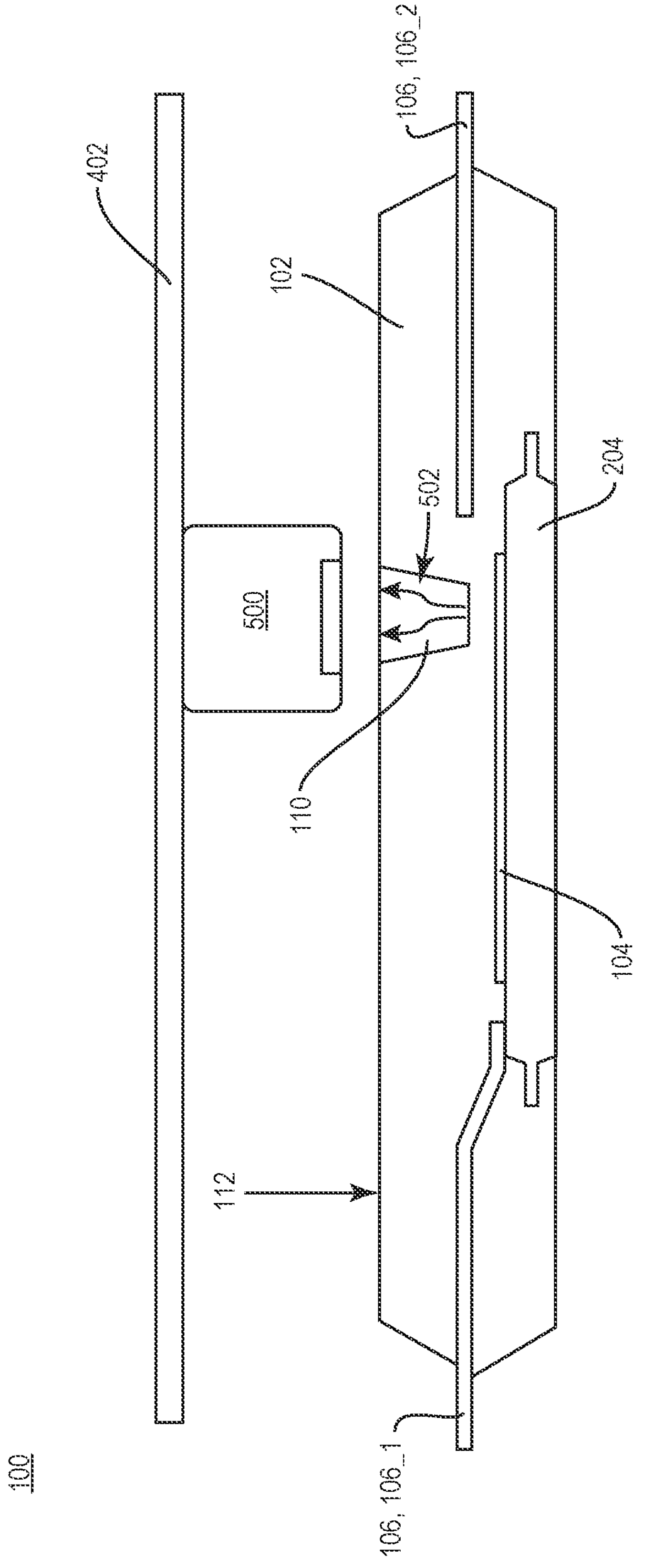
FIG. 7 illustrates a cross-sectional view of the molded package along the line labelled A-A' in FIG. 1, according to another embodiment.

FIG. 7 illustrates a cross-sectional view of the molded package 100 along the line labelled A-A' in FIG. 1, according to another embodiment. In FIG. 7, an infrared (IR) temperature sensor 500 is aligned with the temperature sense cavity 110. The IR temperature sensor 500 detects black-body radiation 502 emitted by the molded package 100 from the temperature sense cavity 110 in the IR spectrum. The IR temperature sensor 500 may be part of an IR camera system used to detect blackbody radiation 502 emitted by the molded package 100 from each temperature sense cavity 110, 110' in the IR spectrum.

Figure 8:
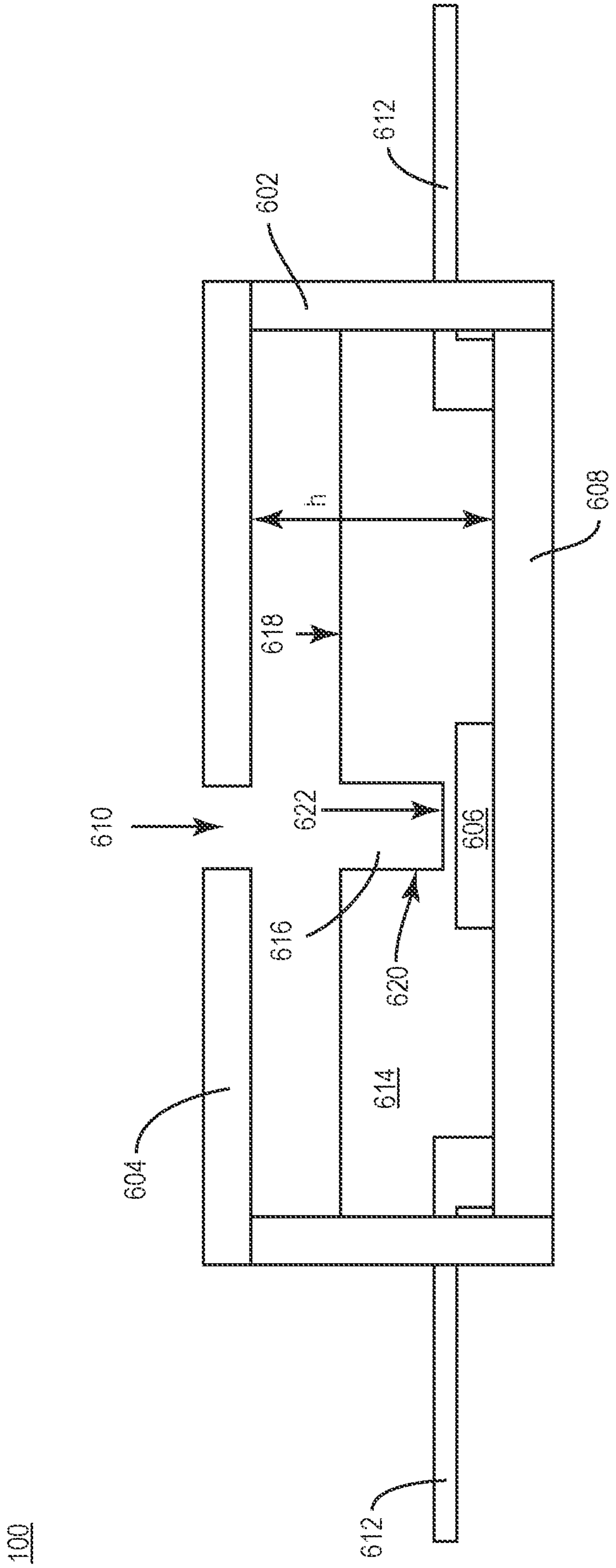
FIG. 8 illustrates a cross-sectional view of a power module.

FIG. 8 illustrates a cross-sectional view of a power module 600. The power module 600 includes an electrically insulative frame 602, a lid (cover) 604, one or more power semiconductor dies 606 attached to a substrate 608 and enclosed by the electrically insulative frame 602, the lid 604 and the substrate 608. The power semiconductor die(s) 606 may form one or more switch devices, e.g., of a half bridge. The substrate 608 may be an IMS, a DBC substrate, an AMB substrate, part of a lead frame, etc. An opening 610 in the lid 604 is dimensioned to receive a temperature sensor (not shown in FIG. 8). The power module 600 also has leads/terminals 602 that protrude from the electrically insulative frame 602 and provide power and/or signal connections to each die 606 included in the module 600.

The power module 600 may further include an electrically insulative encapsulant 614 covering each power semiconductor die 606. The electrically insulative encapsulant 614 may be a silicone gel, potting material, etc. The height 'h' of the electrically insulative encapsulant 614 may extend to the bottom side of the lid 604. A temperature sense cavity 616 may be formed in the surface 618 of the electrically insulative encapsulant 614 that faces the lid 604. The temperature sense cavity 616 is aligned with the opening 610 in the lid 604.

The temperature sense cavity 616 may be formed by mechanical or laser drilling, for example. The temperature sense cavity 616 instead may be formed during potting, e.g., by using a stamp. In each case, the temperature sense cavity 616 is dimensioned to receive a temperature sensor and/or a combined area of each sidewall 620 and a bottom 622 of the temperature sense cavity 616 is greater than the area of the opening 610 in the lid 604, to ensure optimal blackbody radiation emission from the temperature sense cavity 616 in the IR spectrum. In one embodiment, the electrically insulative encapsulant 614 absorbs at least 90% of incident radiation in the IR-spectrum and therefore is considered to be a 'dark' material. For example, the electrically insulative encapsulant 614 may be a dyed silicone gel or potting material.

Figure 9:
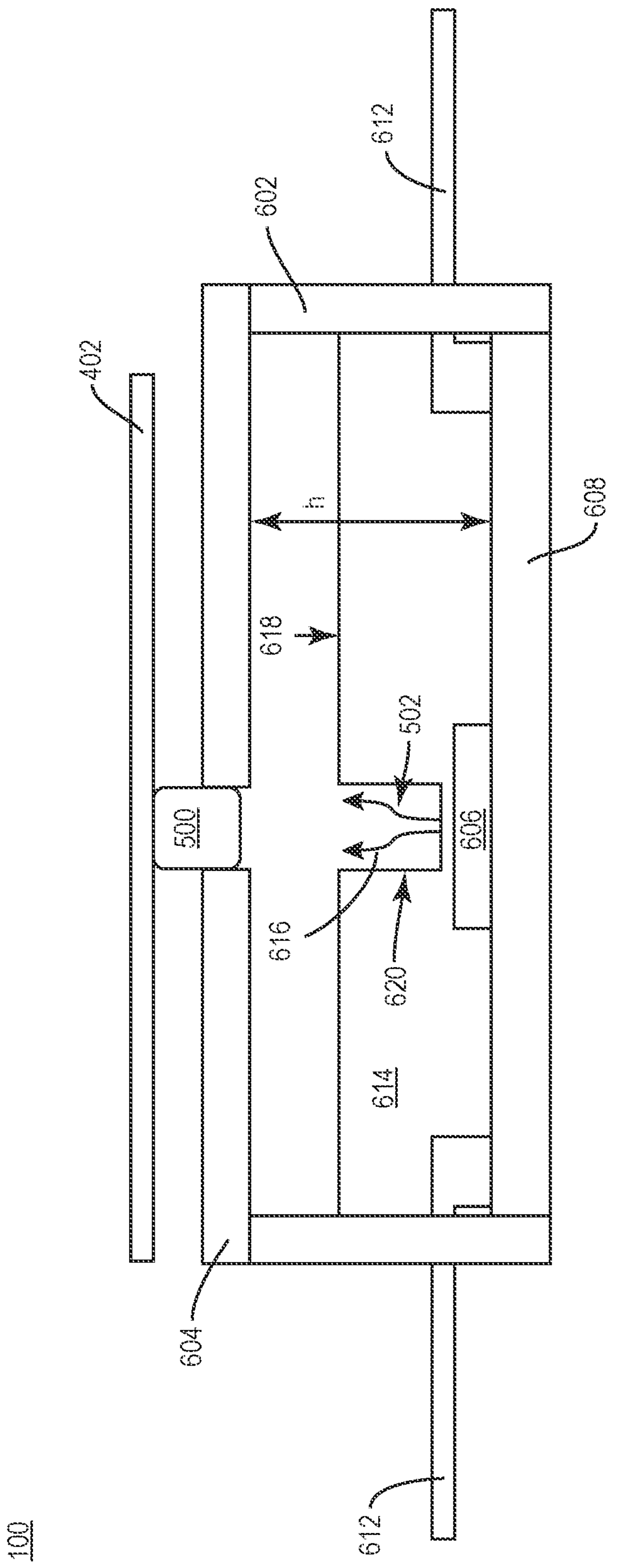
FIG. 9 illustrates a cross-sectional view of the power module, according to another embodiment.

FIG. 9 illustrates a cross-sectional view of the power module 600, according to another embodiment. In FIG. 9, an infrared (IR) temperature sensor 500 is inserted into the opening 610 in the lid 604 and seated in the temperature sense cavity 616 formed in the electrically insulative encapsulant 614. The IR temperature sensor 500 detects blackbody radiation 502 emitted from the temperature sense cavity 616 in the IR spectrum. The IR temperature sensor 500 may be part of an IR camera system used to detect blackbody radiation 502 emitted from the temperature sense cavity 616 in the IR spectrum.

Figure 10:
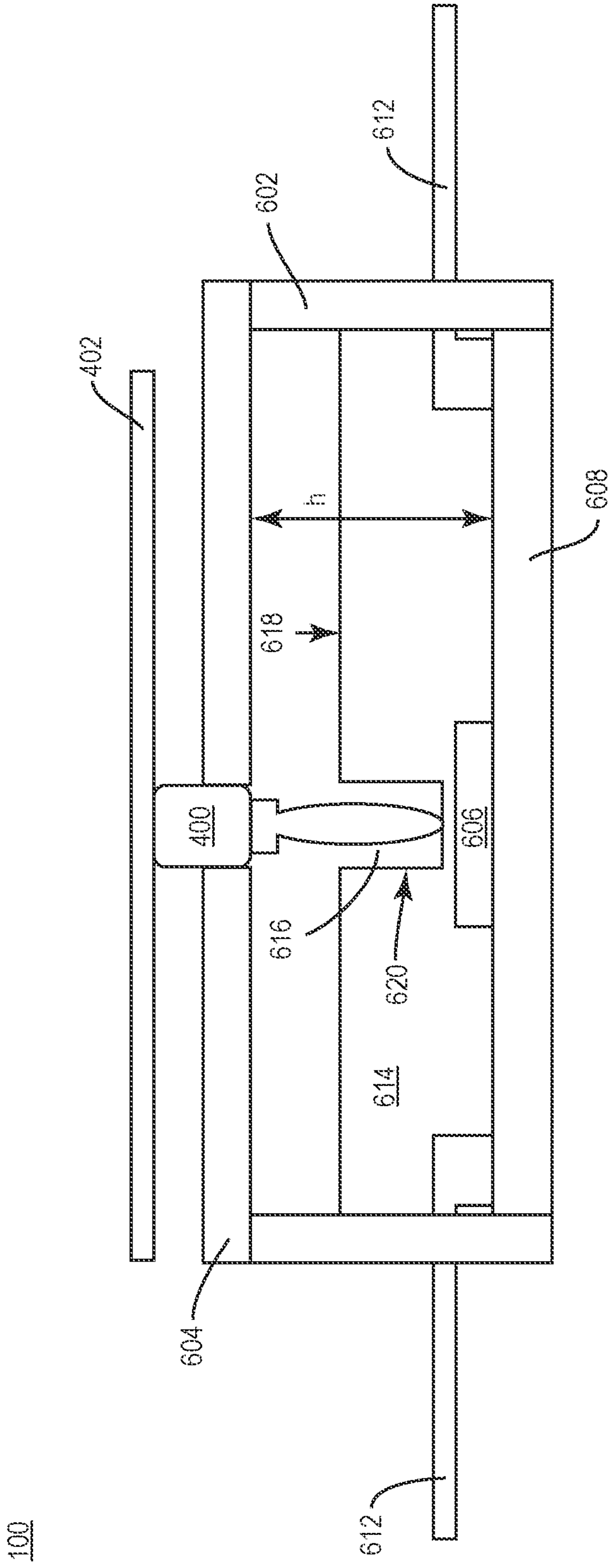
FIG. 10 illustrates a cross-sectional view of the power module, according to another embodiment.

FIG. 10 illustrates a cross-sectional view of the power module 600, according to another embodiment. In FIG. 10, a temperature sensor 400 is seated in the temperature sense cavity 616 formed in the electrically insulative encapsulant 614. The temperature sensor 400 provides direct temperature measurements inside the temperature sense cavity 616. For example, the temperature sensor 400 may be an NTC sensor, a temperature sense diode, a temperature sensing resistor, a thermocouple, etc. The temperature sensor 400 may be epoxy-coated, for example.

A power electronics system 800 including a circuit board may also include the molded package 100 mounted to the circuit board, and a temperature sensor. The temperature sense cavity 100 of the molded package 100 is dimensioned to receive the temperature sensor and/or a combined area of each sidewall 202 and bottom 200 of the temperature sense cavity 110 is greater than an area of the opening 114 in the front surface 112 of the mold compound 102 that delineates the temperature sense cavity 110. The power electronics system 800 may use the power module 600 instead of the molded package 100.

In either case, the temperature sensor may be seated in the temperature sense cavity 110/616 or an infrared sensor aligned with the temperature sense cavity 110/616. Also as previously explained herein, the molded package 100 or power module 600 may include more than one power semiconductor die 104 and a temperature sense cavity 110/616 near each power semiconductor die 104 or the hottest internal part. In this case, the temperature sensor may be part of an infrared camera configured to detect blackbody radiation emitted by the molded package 100 or power module 600 from each temperature sense cavity 110/616 in the IR spectrum.

Although the present disclosure is not so limited, the following numbered examples demonstrate one or more aspects of the disclosure.

Example 1. A molded package, comprising: a mold compound; a first power semiconductor die encapsulated by the mold compound; and a first temperature sense cavity formed in a surface of the mold compound, wherein the molded package is devoid of temperature sense terminals, wherein the first temperature sense cavity is dimensioned to receive a temperature sensor and/or a combined area of each sidewall and a bottom of the first temperature sense cavity is greater than an area of an opening in the surface of the mold compound that delineates the first temperature sense cavity.

Example 2. The molded package of example 1, wherein the mold compound has a thickness less than 1 mm at the bottom of the first temperature sense cavity.

Example 3. The molded package of example 2, wherein the thickness of the mold compound is 200 μm or less at the bottom of the first temperature sense cavity.

Example 4. The molded package of example 1, wherein the mold compound is completely removed from the bottom of the first temperature sense cavity.

Example 5. The molded package of example 4, further comprising a material covering the bottom of the first temperature sense cavity and that absorbs at least 90% of incident radiation in the IR-spectrum.

Example 6. The molded package of any of examples 1 through 5, wherein the first power semiconductor die or a metal structure attached to the first power semiconductor die is exposed from the mold compound at the bottom of the first temperature sense cavity.

Example 7. The molded package of example 6, further comprising a material covering the first power semiconductor die or the metal structure exposed from the mold compound at the bottom of the first temperature sense cavity and that absorbs at least 90% of incident radiation in the IR-spectrum.

Example 8. The molded package of any of examples 1 through 7, wherein each sidewall of the first temperature sense cavity is tapered.

Example 9. The molded package of any of examples 1 through 8, wherein each sidewall of the first temperature sense cavity is roughened.

Example 10. The molded package of any of examples 1 through 9, further comprising a temperature sensor seated in the first temperature sense cavity.

Example 11. The molded package of any of examples 1 through 10, further comprising: a second power semiconductor die encapsulated by the mold compound and electrically connected to the first power semiconductor die to form part of a power electronics circuit; and a second temperature sense cavity formed in a surface of the mold compound, wherein the second temperature sense cavity is dimensioned to receive a temperature sensor and/or a combined area of each sidewall and a bottom of the second temperature sense cavity is greater than an area of an opening in the surface of the mold compound that delineates the second temperature sense cavity.

Example 12. A power module, comprising: an electrically insulative frame; a lid; a first power semiconductor die attached to a substrate and enclosed by the electrically insulative frame, the lid and the substrate; and an opening in the lid, wherein the opening in the lid is dimensioned to receive a temperature sensor.

Example 13. The power module of example 12, further comprising a temperature sensor inserted into the opening in the lid.

Example 14. The power module of example 12 or 13, further comprising: an electrically insulative encapsulant covering the first power semiconductor die; and a temperature sense cavity formed in a surface of the electrically insulative encapsulant that faces the lid, wherein the temperature sense cavity is aligned with the opening in the lid, wherein the temperature sense cavity is dimensioned to receive a temperature sensor and/or a combined area of each sidewall and a bottom of the temperature sense cavity is greater than an area of the opening in the lid.

Example 15. The power module of example 14, further comprising a temperature sensor inserted into the opening in the lid and seated in the temperature sense cavity.

Example 16. The power module of example 14 or 15, wherein the electrically insulative encapsulant absorbs at least 90% of incident radiation in the IR-spectrum.

Example 17. A power electronics system, comprising: a circuit board; a molded package mounted to the circuit board; and a temperature sensor, wherein the molded package comprises: a mold compound; a first power semiconductor die encapsulated by the mold compound; and a first temperature sense cavity formed in a surface of the mold compound, wherein the molded package is devoid of temperature sense terminals, wherein the first temperature sense cavity is dimensioned to receive the temperature sensor and/or a combined area of each sidewall and a bottom of the first temperature sense cavity is greater than an area of an opening in the surface of the mold compound that delineates the first temperature sense cavity.

Example 18. The power electronics system of example 17, wherein the temperature sensor is an NTC (negative temperature coefficient) sensor seated in the first temperature sense cavity.

Example 19. The power electronics system of example 17, wherein the temperature sensor is an infrared sensor aligned with the first temperature sense cavity.

Example 20. The power electronics system of any of examples 17 through 19, wherein the molded package comprises a plurality of power semiconductor dies encapsulated by the mold compound and a temperature sense cavity formed in a surface of the mold compound near each power semiconductor die, and wherein the temperature sensor is part of an infrared camera configured to detect blackbody radiation emitted by the molded package from each temperature sense cavity in the IR spectrum.

Example 21. A power electronics system, comprising: a circuit board; a power module mounted to the circuit board; and a temperature sensor, wherein the power module comprises: an electrically insulative frame; a lid; a first power semiconductor die attached to a substrate and enclosed by the electrically insulative frame, the lid and the substrate; and an opening in the lid, wherein the opening in the lid is dimensioned to receive the temperature sensor.

Example 22. The power electronics system of example 21, wherein the temperature sensor is an NTC (negative temperature coefficient) sensor seated in the temperature sense cavity.

Example 23. The power electronics system of example 21, wherein the temperature sensor is an infrared sensor aligned with the temperature sense cavity.

Example 24. The power electronics system of any of examples 21 through 23, wherein the power module comprises a plurality of power semiconductor dies enclosed by the electrically insulative frame, the lid and the substrate, and an opening in the lid near each power semiconductor die, and wherein the temperature sensor is part of an infrared camera configured to detect blackbody radiation emitted from each opening in the lid in the IR spectrum.

Terms such as "first", "second", and the like, are used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

The expression "and/or" should be interpreted to include all possible conjunctive and disjunctive combinations, unless expressly noted otherwise. For example, the expression "A and/or B" should be interpreted to mean only A, only B, or both A and B. The expression "at least one of" should be interpreted in the same manner as "and/or", unless expressly noted otherwise. For example, the expression "at least one of A and B" should be interpreted to mean only A, only B, or both A and B.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A molded package, comprising:

a mold compound;

a first power semiconductor die encapsulated by the mold compound; and a first temperature sense cavity formed in a surface of the mold compound, wherein the molded package is devoid of temperature sense terminals, wherein the first temperature sense cavity is dimensioned to receive a temperature sensor and/or a combined area of each sidewall and a bottom of the first temperature sense cavity is greater than an area of an opening in the surface of the mold compound that delineates the first temperature sense cavity.

2. The molded package of claim 1, wherein the mold compound has a thickness less than 1 mm at the bottom of the first temperature sense cavity.

3. The molded package of claim 2, wherein the thickness of the mold compound is 200 μm or less at the bottom of the first temperature sense cavity.

4. The molded package of claim 1, wherein the mold compound is completely removed from the bottom of the first temperature sense cavity.

5. The molded package of claim 4, further comprising a material covering the bottom of the first temperature sense cavity and that absorbs at least 90% of incident radiation in the IR-spectrum.

6. The molded package of claim 1, wherein the first power semiconductor die or a metal structure attached to the first power semiconductor die is exposed from the mold compound at the bottom of the first temperature sense cavity.

7. The molded package of claim 6, further comprising a material covering the first power semiconductor die or the metal structure exposed from the mold compound at the bottom of the first temperature sense cavity and that absorbs at least 90% of incident radiation in the IR-spectrum.

8. The molded package of claim 1, wherein each sidewall of the first temperature sense cavity is tapered.

9. The molded package of claim 1, wherein each sidewall of the first temperature sense cavity is roughened.

10. The molded package of claim 1, further comprising a temperature sensor seated in the first temperature sense cavity.

11. The molded package of claim 1, further comprising:

a second power semiconductor die encapsulated by the mold compound and electrically connected to the first power semiconductor die to form part of a power electronics circuit; and a second temperature sense cavity formed in a surface of the mold compound, wherein the second temperature sense cavity is dimensioned to receive a temperature sensor and/or a combined area of each sidewall and a bottom of the second temperature sense cavity is greater than an area of an opening in the surface of the mold compound that delineates the second temperature sense cavity.

12. A power module, comprising:

an electrically insulative frame;

a lid;

a first power semiconductor die attached to a substrate and enclosed by the electrically insulative frame, the lid and the substrate; and an opening in the lid, wherein the opening in the lid is dimensioned to receive a temperature sensor.

13. The power module of claim 12, further comprising a temperature sensor inserted into the opening in the lid.

14. The power module of claim 12, further comprising:

an electrically insulative encapsulant covering the first power semiconductor die; and a temperature sense cavity formed in a surface of the electrically insulative encapsulant that faces the lid, wherein the temperature sense cavity is aligned with the opening in the lid, wherein the temperature sense cavity is dimensioned to receive a temperature sensor and/or a combined area of each sidewall and a bottom of the temperature sense cavity is greater than an area of the opening in the lid.

15. The power module of claim 14, further comprising a temperature sensor inserted into the opening in the lid and seated in the temperature sense cavity.

16. The power module of claim 14, wherein the electrically insulative encapsulant absorbs at least 90% of incident radiation in the IR-spectrum.

17. A power electronics system, comprising:

a circuit board;

a molded package mounted to the circuit board; and a temperature sensor, wherein the molded package comprises:

a mold compound;

a first power semiconductor die encapsulated by the mold compound; and a first temperature sense cavity formed in a surface of the mold compound, wherein the molded package is devoid of temperature sense terminals, wherein the first temperature sense cavity is dimensioned to receive the temperature sensor and/or a combined area of each sidewall and a bottom of the first temperature sense cavity is greater than an area of an opening in the surface of the mold compound that delineates the first temperature sense cavity.

18. The power electronics system of claim 17, wherein the temperature sensor is an NTC (negative temperature coefficient) sensor seated in the first temperature sense cavity.

19. The power electronics system of claim 17, wherein the temperature sensor is an infrared sensor aligned with the first temperature sense cavity.

20. The power electronics system of claim 17, wherein the molded package comprises a plurality of power semiconductor dies encapsulated by the mold compound and a temperature sense cavity formed in a surface of the mold compound near each power semiconductor die, and wherein the temperature sensor is part of an infrared camera configured to detect blackbody radiation emitted by the molded package from each temperature sense cavity in the IR spectrum.

* * * * *